(12) United States Patent
DeNatale

(10) Patent No.: US 7,786,808 B2
(45) Date of Patent: Aug. 31, 2010

(54) MICRO-STRUCTURED OPTIC APPARATUS

(75) Inventor: Jeffrey F. DeNatale, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 203 days.

(21) Appl. No.: 12/129,566

(22) Filed: May 29, 2008

(65) Prior Publication Data

US 2008/0267232 A1 Oct. 30, 2008

Related U.S. Application Data

(63) Continuation-in-part of application No. 11/669,251, filed on Jan. 31, 2007, now Pat. No. 7,619,485.

(51) Int. Cl.
*H03L 7/26* (2006.01)
(52) U.S. Cl. .............................. 331/3; 331/94.1; 372/70
(58) Field of Classification Search .................. 331/3, 331/94.1; 372/70, 72
See application file for complete search history.

(56) References Cited

U.S. PATENT DOCUMENTS

| 5,513,201 A * | 4/1996 | Yamaguchi et al. ............ 372/75 |
| 6,900,702 B2 * | 5/2005 | Youngner et al. ........... 331/94.1 |
| 2006/0209912 A1 * | 9/2006 | Luo et al. ...................... 372/21 |

OTHER PUBLICATIONS

Denatale, J. F. et al., "Compact, Low-Power Chip-Scale Atomic Clock", May 6, 2008, 4 pp.
Gills, John F., Ph.D., "The 300 Year Evolution of the Maksutov-Cassegrain Telescope", Evolution of the Maksutov-Cassegrain Telescope, *Evolution of the Maksutov-Cassegrain Telescope*, (1998): pp. 1-2, <http://w.w.w.weasner.com/ext/guests/mak/MAKSTO.HTM>.

* cited by examiner

*Primary Examiner*—Robert Pascal
*Assistant Examiner*—Levi Gannon
(74) *Attorney, Agent, or Firm*—Koppel, Patrick, Heybl & Dawson

(57) ABSTRACT

A micro-structured optics apparatus includes a concave microlens to expand a beam of light, a reflector to provide a first reflection of at least a portion of the beam of light and a micro-Fresnel lens to collimate the at least a portion of the beam of light after the expansion.

30 Claims, 6 Drawing Sheets

MICRO-STRUCTURED OPTIC APPARATUS

This application is a continuation-in-part of prior application Ser. No. 11/669,251 filed Jan. 31, 2007, now U.S. Pat. No. 7,619,485.

FIELD OF THE INVENTION

This invention relates generally to micro-structured optics. More particularly, to a chip-scale or micro-structured optic apparatus for use in, for example, an atomic clock.

BACKGROUND

Atomic clocks and precision timing devices are an integral part of GPS (Global Positioning System) and GNSS (Global Navigation Satellite System) devices, as well as cellular telephone systems, secure communication protocols, distributed networks, etc. As the sophistication of these systems continues to improve, and data rates continue to increase, the demand for smaller, lower power, more compact timing devices increases as well. Whereas a volumetric footprint of 100 $cm^3$ was once considered more than acceptable for a physics package of an atomic clock, future devices, especially portable devices, will require a timing device ten to one-hundred times smaller than this size.

Efforts are ongoing in the development of such a compact, low-power time/frequency standard ("Chip-Scale Atomic Clock," or CSAC). There are a number of approaches that may be taken to create a CSAC based on various optical and/or microwave excitation techniques. One such approach, known as Coherent Population Trapping (CPT) uses a single optical source modulated at microwave frequencies to generate the atomic states which can serve as frequency references. Other approaches use microwave excitation and optical interrogation in their operation. At the heart of the CSAC is the hardware assembly to create and interrogate the optical frequency reference known as the physics package. Consider for a moment the physics package 100 for a typical CPT-based CSAC system presented in FIG. 1. As with many prior art systems, the physics package is arranged in a linear fashion with a vertical cavity surface emitting laser ("VCSEL") 102 spaced significantly apart from a vapor cell 104 and a photodiode which is a detector 106. As can be appreciated by those skilled in the art, the VCSEL 102 generates a beam of light which illuminates and interrogates alkali atoms contained within the vapor cell 104. Multiple window heaters, e.g. heaters 108 and 110, are used to heat both vapor cell 104 and VCSEL 102.

Given the size constraints of the optics (lens) 112 in this prior art system, a relatively long path length is required to achieve a beam width of 2 mm or more. A wide beam width (on the order of 2 mm) is required to ensure a sufficient volume of gaseous atoms contained in the vapor cell 104 is illuminated and excited. Other components such as the ND filter 114 and the waveplate 116 only add to the overall physics package size.

There are a number of limitations with many of the atomic clock/physics packages known in the prior art. As noted above, substantially longer path lengths are required to achieve a proper light beam diameter. Longer path lengths equate to larger volumes, which are unsuited for many handheld portable devices. Further, physical separation of the VCSEL from the vapor cell can require multiple heaters, which may be an inefficient method of heating that consumes an undue amount of power. Therefore, controlling the heating of the VCSEL and vapor cell to ensure consistent and stabilized temperature operations with low operating power can be very difficult.

For these reasons and others, many atomic clock designs now employ a "folded" optics configuration, wherein components are co-located and/or efficiently positioned to reduce volume and power consumption. For example, in many prior art systems the VCSEL and photodiode detector are co-located on a single chip or board. These systems may further reduce path length by utilizing one or more reflectors to redirect light through the vapor cell, thereby minimizing the overall path length. While these systems (atomic clocks) may offer some improvement over more traditional systems, they still have performance issues. Such a configuration may require a custom VCSEL/detector element, and the optical arrangement can result in non-uniform intensity and polarization of light passing through the vapor cell, which can compromise ultimate performance.

Hence there is a need for a compact optics physics package to address one or more of the drawbacks identified above.

SUMMARY

A micro-structured optics apparatus is disclosed for use in, in one embodiment, a chip-scale atomic clock. The micro-structured optics apparatus includes a concave microlens to expand a beam of light, a reflector to provide a first reflection of at least a portion of the beam of light, and a micro-Fresnel lens to collimate the at least a portion of the beam of light after the expansion. In another embodiment, a physics package apparatus includes a concave microlens formed in a substrate to expand a beam of light, a reflector to reflect the beam of light, and a micro-Fresnel lens formed in the substrate, the micro-Fresnel lens established along a central axis of the reflector to collimate a portion of the beam of light after the reflection.

DETAILED DESCRIPTION

A micro-structured optics apparatus is disclosed for use in, in one embodiment, a chip-scale atomic clock. The micro-structured optics apparatus includes a concave microlens to expand a beam of light, a reflector to provide a first reflection of at least a portion of the beam of light, and a micro-Fresnel lens to collimate the at least a portion of the beam of light after the expansion, such that the micro-structured apparatus provides a substantially shorter path length for expansion and collimation of light in comparison to prior art optics systems.

Figure 1:
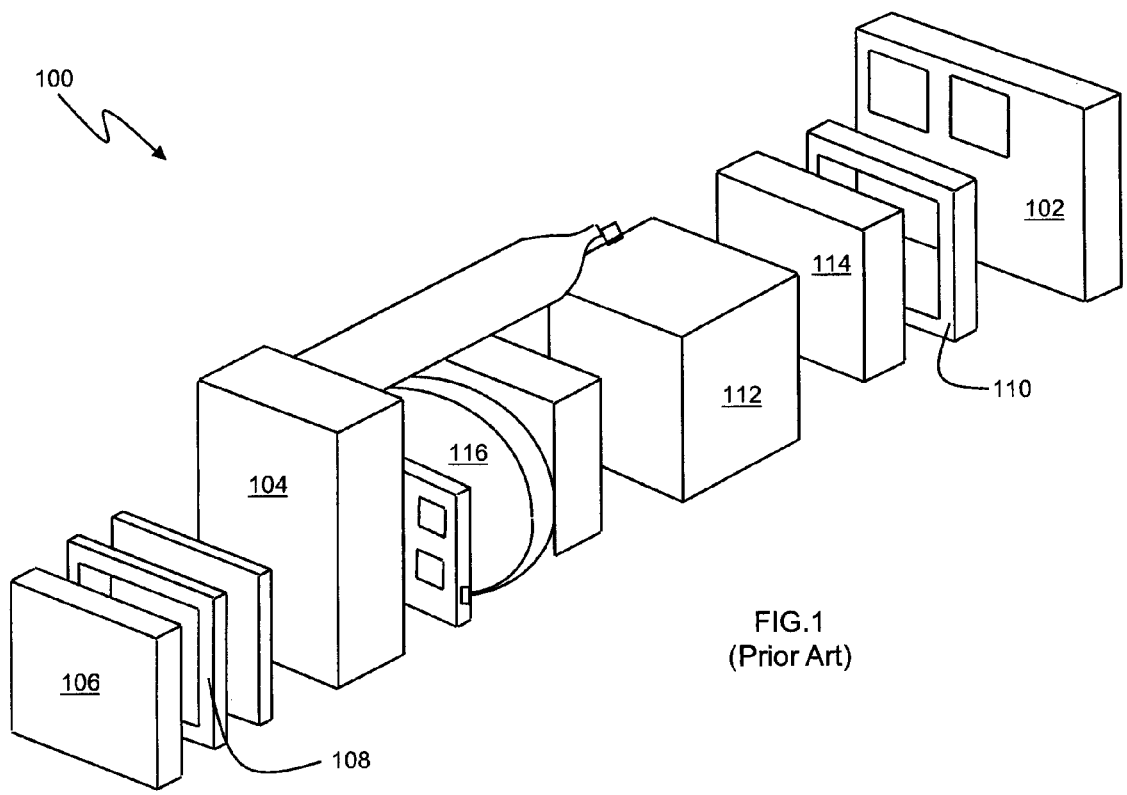
FIG. 1 is a perspective representation of a prior art of chip-scale atomic clock.
Figure 2:
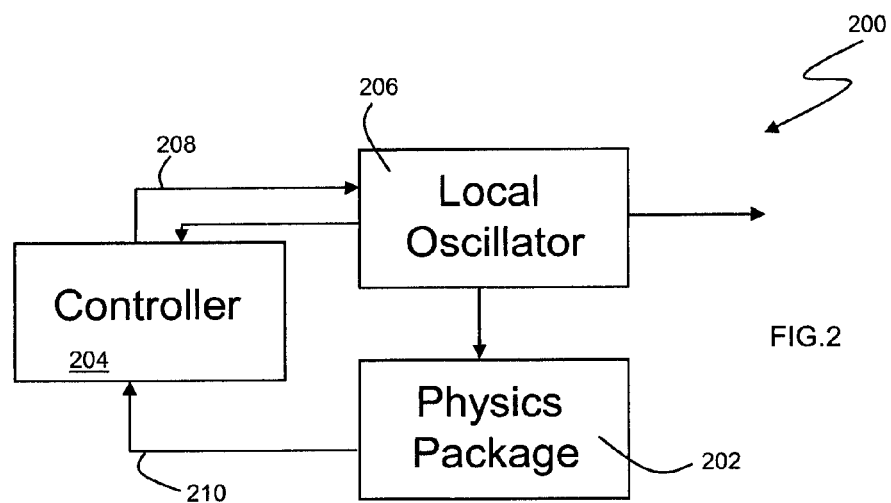
FIG. 2 is a plan view of a simplified atomic clock system, according to an embodiment.

Referring now to FIG. 2, a simplified schematic of the system level "architecture" of the present disclosure, to with an optical or atomic clock 200, is presented. In particular, the compact optical assembly or physics package 202, which is the functional element used to establish the necessary and stabilized timing frequency, is interconnected electrically to both a controller 204 or micro-controller and a frequency modulation source, such as a local oscillator or voltage controlled oscillator ("VCO") 206. The components 202-206 are structured and arranged such that controller 204 establishes and ultimately locks the frequency of VCO 206 via control signals represented by arrow 208. Specifically, control signal 208 is an error correction sent to VCO 206 based on the output signal 210 received from physics package 202, as discussed in greater detail below. In summary, the output 210 of physics package 202 derives from a comparison of the output frequency of VCO 206 and the atomic resonant frequency generated within physics package 202. In the closed-loop system described, as the delta between the VCO output 206 and the atomic frequency (based on the atomic transition of excited alkali atoms) decreases, the atomic clock 200 approaches the accuracy and stability necessary to function properly.

Figure 3:
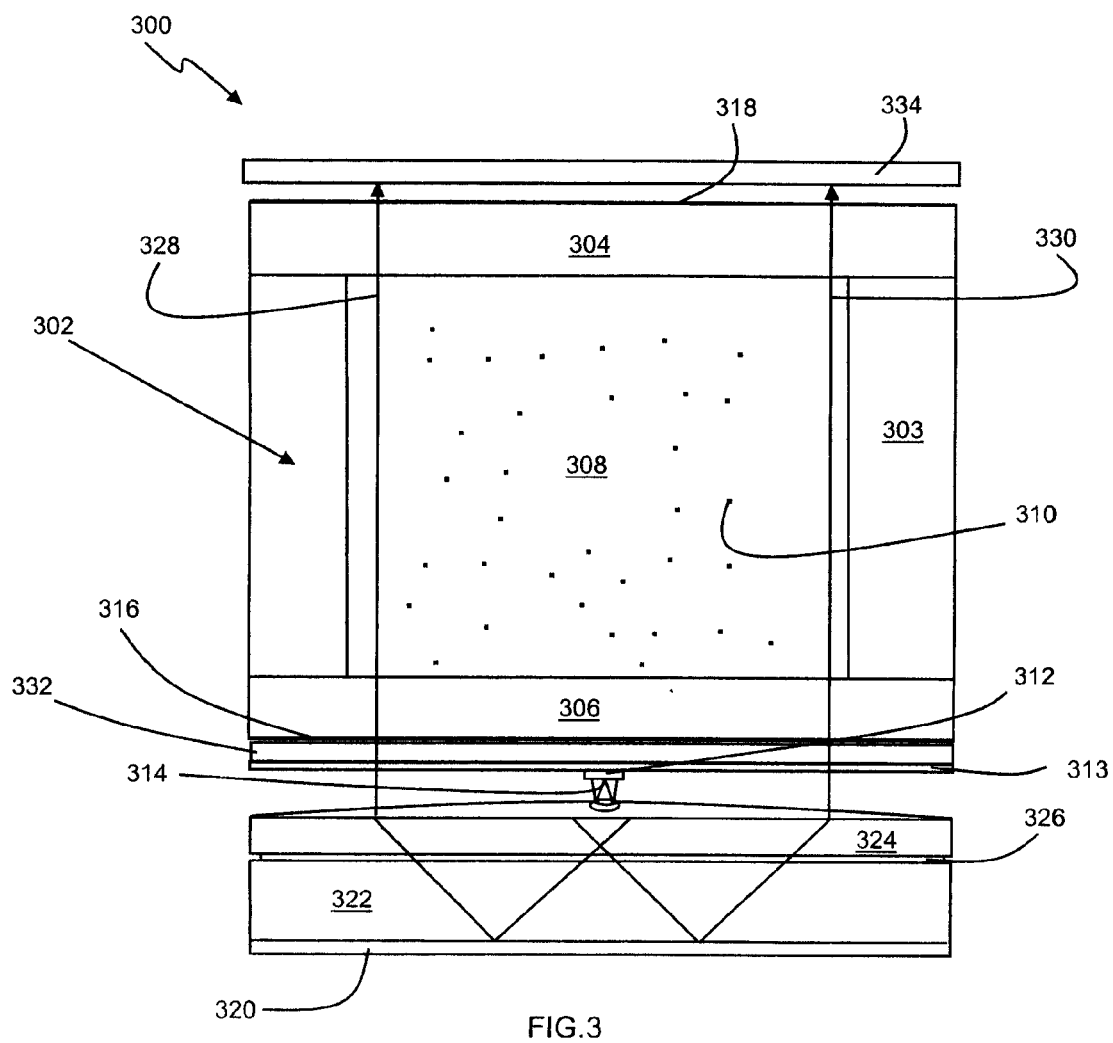
FIG. 3 is a plan view of a physics package of a chip-scale atomic clock, according to an embodiment.

Considering now FIG. 3, a compacted or "folded" physics package 300 for use in an atomic clock (such as atomic clock 200 in FIG. 2) is provided. Integral to physics package 300 is a vapor or resonance cell 302. In at least one embodiment, vapor cell 302 is manufactured using silicon to form the walls of the cell, e.g. wall 303. In yet another embodiment, other alkali resistant materials may be used in lieu of silicon. Vapor cell 302 may include two substantially transparent windows 304 and 306, which may be Pyrex®. As shown in FIG. 3, windows 304 and 306 are positioned opposite one another and separated by a center section or cavity 308 of cell 302. The windows 304, 306 in conjunction with the walls of cell 302, e.g. wall 303, form a containment vessel for encapsulating a concentration of gaseous atom species such as gaseous alkali atoms 310. In one embodiment, the alkali atoms are cesium, and in yet another embodiment the alkali atoms may be rubidium. It can be appreciated, however, that other atoms having the necessary atomic structure and excitation characteristics may be used without departing from the scope and intent of this disclosure. Also contained within cavity 308 are inert buffer gases (not shown) which may be (but are not limited to) nitrogen, argon, or neon.

Still referring to FIG. 3, an optical source which may be a vertical cavity surface emitting laser ("VCSEL") 312 is mounted to a support surface 313 in close proximity to window 306. VCSEL 312 may be mounted by any one of several techniques known in the art, to include bonding, for mechanically fastening or joining two components. Of note, the mounting scheme selected must ensure the thermal conductivity between vapor cell 302 and VCSEL 312 is maintained. In one embodiment, a separate transparent substrate, e.g. 313, is used to support the VCSEL. In another embodiment, the vapor cell window itself may be used as the VCSEL support. VCSEL 312 is positioned such that an output aperture 314 of VCSEL 312 is oriented or directed away from vapor cell 302. Stated differently, any laser light emitted by VCSEL 312 will not directly strike or pass through vapor cell 302 unless that light is subsequently reflected.

Positioned on, integral to, or thermally in contact with window 306 are one or more heating elements or heaters, of which heating element 316 is exemplary. The heating elements, e.g. heating element 316, are structured and arranged to simultaneously heat both vapor cell 302 and VCSEL 312 to a predetermined and required temperature or temperature range. By substantially co-locating vapor cell 302 and VCSEL 312, and positioning a heating element 316 in thermal contact with both, the physical dimensions of physics package 300, and hence the atomic clock, are minimized. Further, overall system level power consumption is reduced as a single heating element 316, or a single array of heating elements, can heat both components (302, 312), thereby eliminating the need for multiple heaters. Depending on the relative temperatures desired for the vapor cell 302 and VCSEL 312, a separate heater element may be incorporated for one or the other to fine-tune the individual component temperature over a narrow range, with the bulk of the heating provided by the common (shared) heater. Temperature stability, minimized package volume, and reduced power consumption are three advantages recognized through the integration of a single heating element. In one embodiment, heating element 316 is a transparent conductor (resistive heater) formed using transparent conductive materials, such as Zinc Oxide or Indium Tin Oxide. Regardless, heating element 316 is substantially transparent to allow the transmission of laser light through window 306 and into cavity 308. In another embodiment, the heaters may use opaque materials, such as resistive metal heaters, and be located outside the clear aperture of a vapor cell window. For either embodiment, the heaters may be on separate substrates or fabricated directly on a vapor cell window.

In at least one embodiment, a second heating element 318, or array of heating elements, may be positioned between window 304 and a photodetector 334 to provide additional heating capacity and stability. In this configuration, heating elements 316 and 318 may be "½" heaters. Using ½ heaters, the overall power savings realized through the use of a single heating element (e.g. element 316) is maintained while the system level temperature stability goals are still met. Additionally, more uniform heating may be realized as heat is applied to the encapsulated alkali atoms from both a "top" and a "bottom" position.

Optically aligned with VCSEL 312 is a reflector 320. Reflector 320 may be any of a type well known in the art for reflecting light generated by a laser diode, such as VCSEL 312. Reflector 320 is positioned a predetermined and fixed distance from aperture 314, and is oriented to reflect light generated by VCSEL 312 into vapor cell 302. The precise spacing and orientation of reflector 320 is determined, in part, by the lens configuration employed in physics package 300, as discussed in greater detail below. In at least one embodiment, a spacer 322 is used to properly distance reflector 320 from VCSEL 312 and an associated dual-focus optical element 324. Also, an intensity control element, which may be a neutral density or ND filter 326 may be used to reduce the energy level of the light beams entering vapor cell 302. A polarization control element or device, such as a quarter waveplate 332, may be used to control the polarization state of the light passing through the vapor cell.

Turning now to the dual-focus optical element 324, as shown in FIG. 3 the element 324 is optically aligned with aperture 314 of VCSEL 312, and is integrated between VCSEL 312 and reflector 320. Dual-focus optical element 324 is structured and arranged to both direct light received from VCSEL 312 toward reflector 320, and to subsequently collimate and direct reflected light, e.g. light beams 328 and 330, into cavity 308 of vapor cell 302. In at least one embodiment, the dual-focus optical element 324 is an axially symmetric optic.

Figure 4:
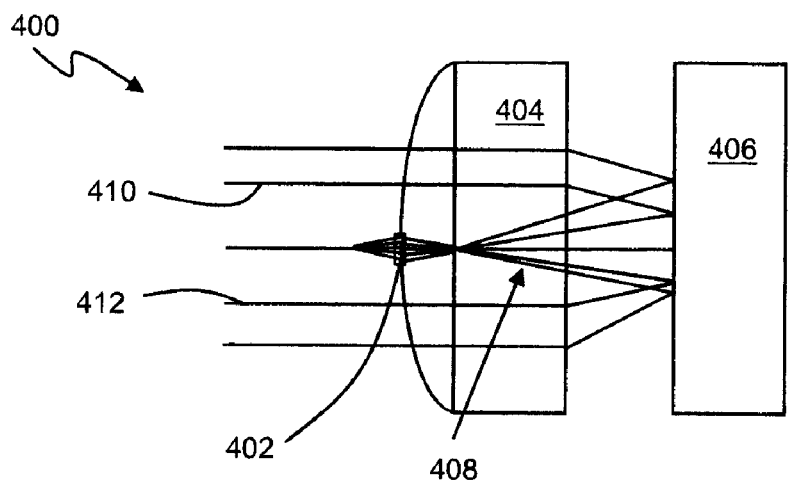
FIG. 4 is plan view of a dual-focus, axially symmetric optic, specifically a micro-lens on mini-lens, according to an embodiment.

Cross-referencing for a moment FIGS. 3 and 4, one implementation of a dual-focus axially symmetric optical element 400 is presented. In one embodiment, optic 400 includes a section of the optical element 400 which may be a refractive micro-lens 402 incorporated into a mini-lens 404 (a micromini lens assembly). Based on the radius of curvature ("ROC") of micro-lens 402, light striking the lens assembly will be refracted toward a reflector (e.g. reflector 320 in FIG. 3 and reflector 406 in FIG. 4) with a known distribution or beam expansion pattern, such as pattern 408 in FIG. 4. It can be appreciated that micro-lens 402 may be concave or convex depending on the overall component design of the dual-focus axially symmetric optic 400. Further, micro-lens 402 may be diffractive. This micro-lens serves to more rapidly expand the transmitted light beam to reduce the propagation distance necessary to reach the desired beam diameter. Reflected light, of which light beams 410 and 412 are exemplary, is collimated as a result of passing back through a second section of optical element 400, which may be a mini-lens 404, in route to vapor cell 302. Of note, the larger ROC of mini-lens 404 provides for the light collimation necessary to properly interrogate or illuminate substantially all of the volume of cavity 308. Mini-lens 404 may be: a diffractive mini-lens, a refractive mini-lens, a Fresnel mini-lens, and a kiniform mini-lens. Micro-lens 402 and mini-lens 404 may be manufactured from materials which include glass, ceramic and various polymer compound materials.

Figure 5:
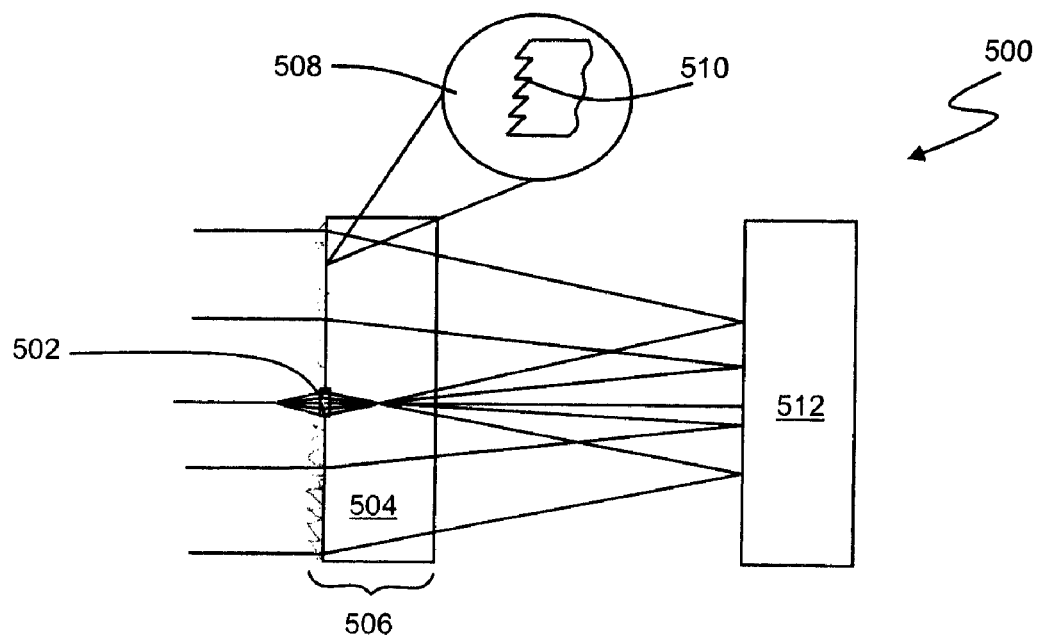
FIG. 5 is plan view of a dual-focus, axially symmetric optic, specifically a hybrid Fresnel lens, according to an embodiment.

In yet another embodiment of a dual-focus axially symmetric optic 500, as shown in FIG. 5, a micro-lens 502 is integrated with a Fresnel lens 504 to form a hybrid Fresnel lens element or lens assembly 506. As shown in the exploded view 508 of Fresnel lens 504, the lens 504 may have a "stair step" or "saw tooth" surface pattern 510. The surface pattern 510 is defined in concert with the shape and ROC of microlens 502 to provide the desired optical focusing properties of optic 500. As with the optic 400 in FIG. 4, the micro-lens 502 may be either concave or convex. Light reflecting off a reflector, e.g. reflector 512, is once again collimated prior to reaching vapor cell 302. Whether symmetrical or asymmetrical, the hybrid lens element, e.g. element 506, may be fabricated using various techniques, to include but not limited to reflow microlens processing, grayscale lithography, and fine-scale mechanical turning. While a number of embodiments of the dual-focus optic have been shown as examples, these are not intended to limit the scope of the invention. Other approaches to both the beam expansion and beam collimation may be implemented by those skilled in the art.

Returning again to FIG. 3, a polarization control element (such as waveplate) 332 is positioned in a region of substantially collimated light between dual-focus optical element 324 and vapor cell 302. More specifically, waveplate 332 is structured and arranged such that light emitted from VCSEL 312 does not pass through waveplate 332, however, light once reflected off reflector 318 passes through waveplate 332 in route to cell 302. In at least one embodiment, waveplate 332 is an annular, two-layer quarter waveplate. As the light, e.g. light beams 328 and 330, passes through waveplate 332, the light is circularly polarized prior to illuminating gaseous atoms in cavity 308. In another embodiment, the waveplate may be located between the vapor cell 302 and VCSEL support 313, as shown in FIG. 3.

An intensity control element (such as neutral density filter 326) may be used to reduce the intensity of the VCSEL 312 illumination. This may be located between the dual-focus optical element 324 and the reflector 320. In this configuration, the dual-pass of the optical beam through the ND filter 326 can reduce the physical thickness needed to obtain a given level of optical attenuation. In one embodiment, the dimensions of the dual-focus optical element 324 and the ND filter 326 are chosen to permit direct bonding of the ND filter 326 to the optical element and metallization of the ND filter 326 back surface to serve as the reflector 320. In this configuration, the bonded optical element reduces the number of parts involved in the physics package assembly. The bonding of these elements with properly selected optical adhesives can reduce the amount of reflected energy at air/glass surfaces and reduce the need for antireflective coatings.

A detector or photodetector 334 is positioned to receive or detect light beams passing through vapor cell 302, and more specifically cavity 308. As is discussed in greater detail below, light passing through cavity 308 interrogates gaseous alkali atoms 310 encapsulated in the cavity 308. As a result, a certain portion of the passing light is absorbed, based on the frequency or wavelength of the light. Detector 334 is in close proximity to window 304 such that light passing out of vapor cell 302 through window 304 strikes detector 334. Detector 334 may be any of a type of photo-detector well known in the art for detecting laser light.

While an axially symmetric optical configuration is shown in FIG. 3 for simplicity, the essential features of the present invention can be implemented in non-axially symmetric configurations as well. For example, an optical source can be placed at locations other than the center of the cell aperture (and even outside the aperture), and the light may be directed through reflection into the vapor cell using a prism in place of a plane parallel reflector. In this configuration, the dual-focus optic would similarly have a non axially symmetric arrangement of the microlens and minilens elements.

Figure 6:
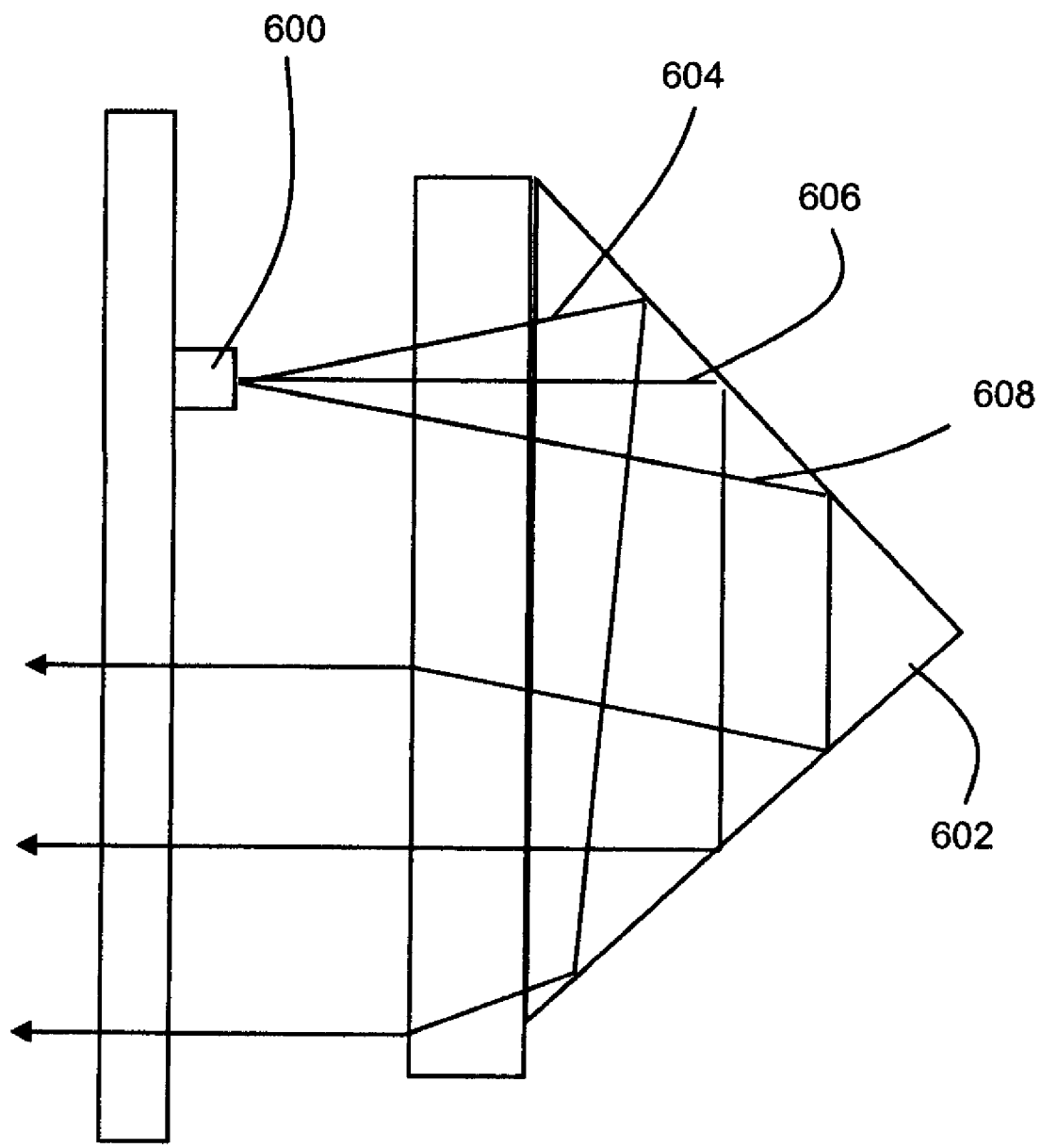
FIG. 6, is a plan view of a collimator prism with VCSEL, according to an embodiment.

Referring for a moment to FIG. 6, in at least one embodiment the VCSEL 600 is aligned with a reflector which is a collimator prism 602, such that VCSEL 604 is located outside the aperture of the vapor cell (e.g. vapor cell 302 in FIG. 3). As shown in FIG. 6, light emitted by VCSEL 600, such as light rays 604, 606 and 608, is reflected by collimator prism 602 and directed back toward a photodetector, such as photodetector 334 in FIG. 3. In summary, as discussed above the reflector may be a planar reflector, a curved reflector, or a prism.

Figure 7:
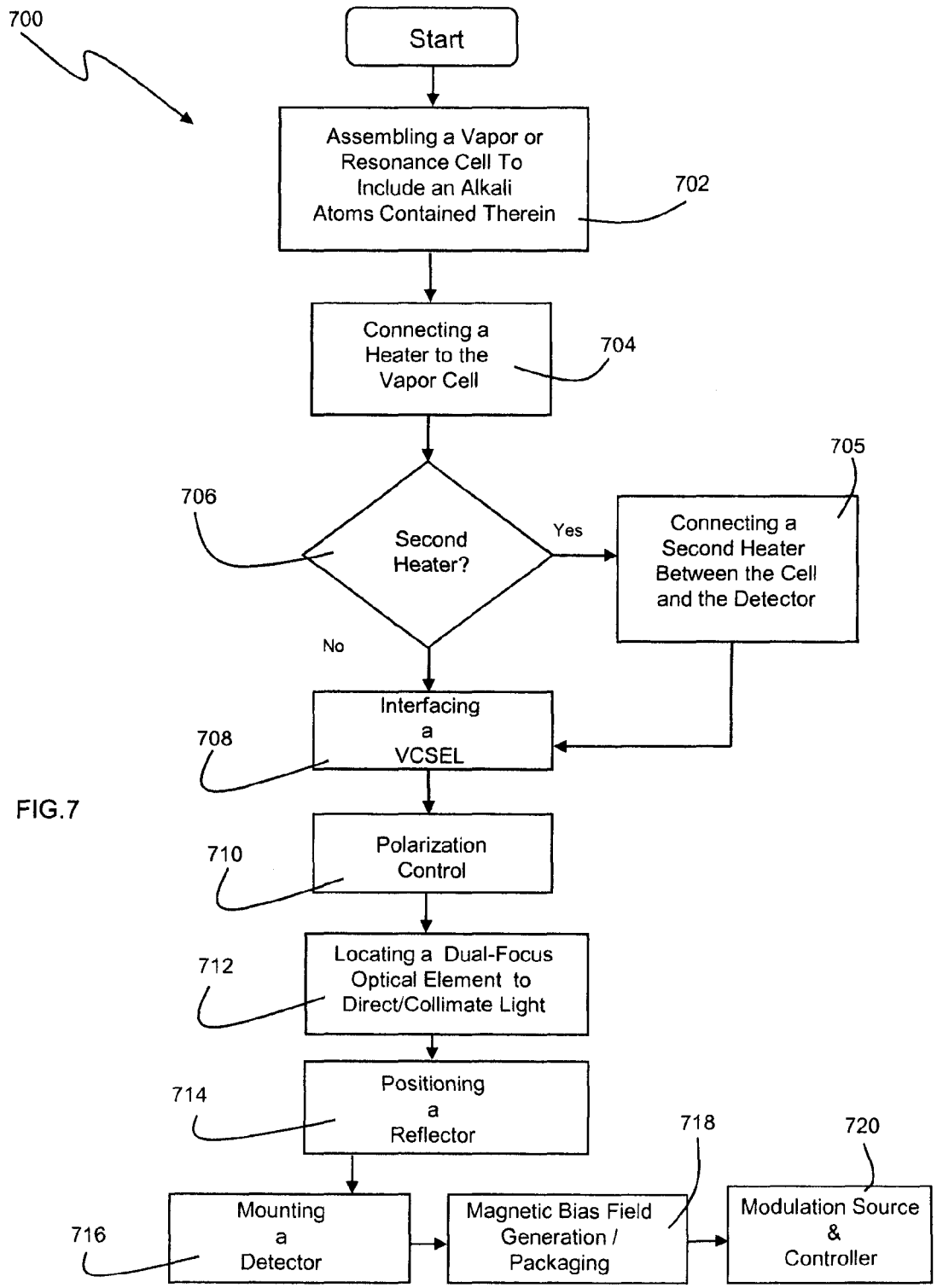
FIG. 7 is a flow chart of a method of manufacturing an atomic clock, according to an embodiment.

A simplified process 700 for manufacturing a physics package for an atomic clock of the present application is presented in FIG. 7. It should be understood that the sequence of steps presented in FIG. 7 is illustrative in nature, and alternate sequencing may be defined without departing from the scope and intent of this disclosure. Further, the manufacturing processes described herein may incorporate and take advantage of advances made in microelectromechanical fabrication techniques, used to manufacture chip-scale electronic components and subsystems.

An initial step in the manufacturing process is to select and assemble a vapor cell with gaseous alkali and buffer atoms contained therein, block 702. As noted above, the vapor cell may be manufactured of silicon with at least two windows made of Pyrex® or some other substantially transparent, alkali resistant material. Concurrent with, or subsequent to, the manufacture of the vapor cell is the integration of one or more heating elements, block 704. At least one heating element is positioned between the vapor cell and the VCSEL. A second heating element may be incorporated in close proximity to the second transparent window of the vapor cell, block 705. A decision as to whether to include a second heater, block 706, may be depend in part on the defined operating temperature of the vapor cell and VCSEL, and the need to better stabilize the temperature of the gaseous contents of the cell cavity. Heaters may be transparent and within the window clear aperture or opaque and outside the clear aperture.

Once the vapor cell and required heating elements are complete, the VCSEL must be integrated with the vapor cell (block 708) to establish a thermal conductance path between the two while maintaining optical transparency. The VCSEL may be mounted on a separate carrier or may be mounted directly to the vapor cell window. Polarization control, block 710, is included in the form of a waveplate or other means for establishing light polarization well known in the art.

Precisely locating a dual-focus optical element, block 712, is necessary to ensure that beam expansion on the first pass of light through the lens element, and the collimation of reflected light on the second pass through the element, is optimized. Collimation is particularly key in order to properly illuminate and excite the maximum volume possible of alkali atoms. A reflector is then positioned (block 714) to reflect light emitted from the VCSEL. The position and spacing of each component in the physics package of the atomic clock assembly is carefully defined and maintained in order to define a beam path for the emitted light that is adequate yet minimal in length. For example, the reflector must be located sufficiently apart from the VCSEL to ensure proper beam expansion and reflected beam collimation, yet close enough to provide the space savings desired for the overall system package.

Following location of the dual-focus optical element, the reflector, etc., the detector is mounted on the side of the vapor cell opposite the lens, reflector and VCSEL, block 716. Elements providing control of the intensity and polarization of the VCSEL illumination are located appropriately depending upon the specific embodiment desired. Magnetic field bias generation/component packaging (block 718) is followed by control electronics and a controller/micro-controller which are integrated into the atomic clock, as is the modulation source, block 720.

Figure 8:
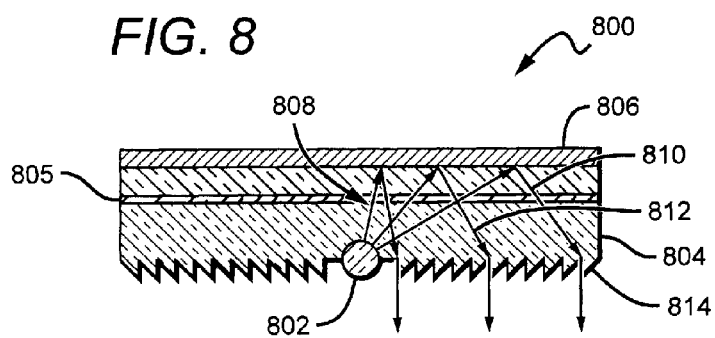
FIG. 8 is a plan view of a dual-focus, axially symmetric optic, specifically a hybrid Fresnel lens that has a concave microlens and one reflector, according to an embodiment.

In yet another embodiment of a dual-focus axially symmetric optic 800, as shown in FIG. 8, a refractive micro-lens 802 is integrated with a Fresnel lens 804. The micro-lens 802 is preferably concave, but may be convex or diffractive. Light entering micro-lens 802 is refracted and preferably passed through a filter, such as ND filter 805, towards reflector 806 and with a known distribution or beam expansion pattern 808 for a first reflection. Reflected light, of which light beams 810 and 812 are exemplary, is collimated as a result of passing back through surface pattern 814 of the Fresnel lens 804 in route to a vapor cell (not shown).

Figure 9:
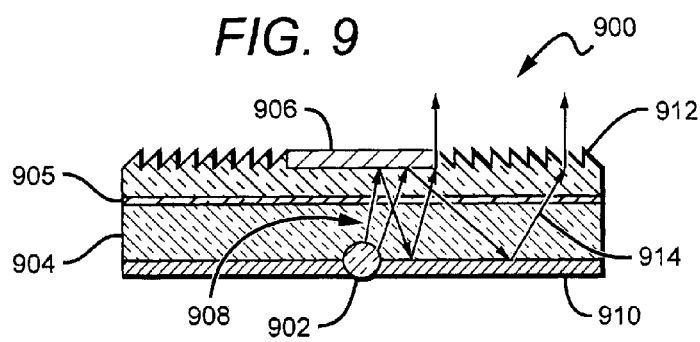
FIG. 9 is a plan view of a dual-focus, axially symmetric micro-structured optic, specifically a hybrid Fresnel lens that has a concave microlens and two reflectors, according an embodiment.

FIG. 9 illustrates another implementation of a dual-focus axially symmetric optical element 900. A micro-lens, preferably a concave micro-lens 902, is established on one side of a Fresnel lens 904. Although illustrated as concave, micro-lens 902 may also be convex or diffractive. A reflector, preferably a planar reflector 906, is established on a second side of the Fresnel lens in complimentary opposition to the micro-lens 902. Light entering micro-lens 902 is refracted and preferably passed through ND filter 905 towards reflector 906 in a predetermined pattern 908. The light 908 is reflected by the reflector 906 for a second pass through the ND filter 905 to an annular reflector 910 formed around the micro-lens 902. Annular reflector 910 enables a second reflection and a third pass through ND filter 905 to a surface pattern 912 of the Fresnel lens 904 for collimation of the reflected and filtered light 914 out of the optical element 900.

Figure 10:
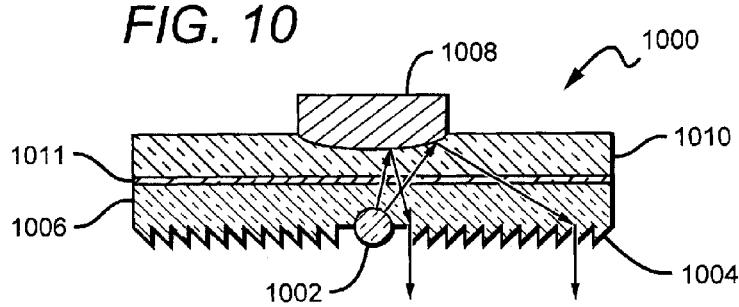
FIG. 10 is a plan view of a dual-focus, axially symmetric micro-structured optic, specifically a hybrid Fresnel lens that has a concave microlens and one non-planar reflector, according an embodiment.

FIG. 10 illustrates another implementation of a dual-focus axially symmetric optical element 1000. Optic element 1000 has a micro-lens 1002 integrated into a surface pattern 1004 of a Fresnel lens 1006. A non-planar reflector, preferably a convex reflector 1008, is established on a side of the Fresnel lens opposite the micro-lens 1002 for receipt of light 1010 refracted through the micro-lens 1002 and preferably passed through ND filter 1011. The light 1010 is experiences a first reflection off of the concave reflector 1006 for a second pass through ND filter 1011 and collimation by surface pattern 1004 as the light exits the optic element 1000.

Figure 11:
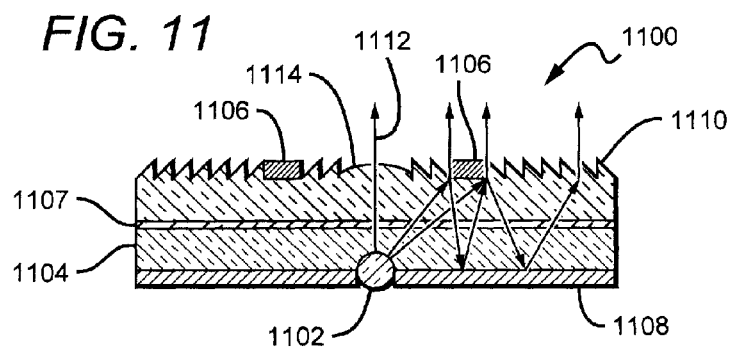
FIG. 11 is a plan view of a dual-focus, axially symmetric micro-structured optic, specifically a hybrid Fresnel lens that has a concave microlens, an annular first reflector, a second reflector and a central transmissive Fresnel, according an embodiment.

In FIG. 11, as in FIGS. 8-10, a dual-focus axially symmetric optic 1100 is illustrated with a concave micro-lens 1102 on one side of a Fresnel lens 1104. In the present implementation, an annular reflector 1106 is established on a second side of the Fresnel lens in complimentary opposition to the micro-lens 1102 so that a portion of light refracted through the micro-lens 1102 and preferably passed through ND filter 1107 is reflected by annular reflector 1106 for a second pass through ND filter 1107 back to a second annular reflector 1108 formed around the micro-lens 1102. The light experiences a second reflection by the second annular reflector 1108 for a third pass through ND filter 1107 back to a surface pattern 1110 for collimation. A portion of light 1112 originally refracted through micro-lens 1102 is not captured by either annular reflector 1106 or surface pattern 1110, but continues through ND filter 1107 and a second central transmissive Fresnel lens 1114 to exit the optic 1100.

The dual-focus axially symmetric optical elements presented in FIGS. 8-11 may each be manufactured from materials which include glass, ceramic and various polymer compound materials and may be fabricated using various techniques, to include but not be limited to reflow micro-lens processing, grayscale lithography, and fine-scale mechanical turning. The respective ND filters preferably provided in each of the embodiments illustrated in FIGS. 8-11 are inventively positioned such that light refracted through respective micro-lenses is provided with at least two passes through each respective ND filter to provide duplicative filtering effects with only a single ND filter, thus reducing required filter thickness for a given filter value.

In operation, the physics package and atomic clock of the present disclosure are used to synchronize and precisely time GPS-based navigation systems, SatCom terminals, secure communication systems, and a whole host of electronic devices ranging in size from satellites to hand-held modules. More particularly, the vapor or resonance cell is heated to an operating temperature that may range from between approximately +40° C. to 120° C. Typical operating ranges may be on the order of 65-95° C. Heating to a temperature of approximately 75° C. generates a sufficient density of cesium atoms to ensure a proper signal-to-noise ratio for the clock. If rubidium is used, the operating temperature may be as high as 90° C. Concurrently, the VCSEL is heated to a temperature to achieve the desired wavelength of emitted light and temperature stabilized to the desired operating temperature.

The VCO generates a frequency which initially is unstable. This "modulation" frequency is used to modulate or vary the current input to the laser diode which is the VCSEL. Through a series of iterative steps using coherent population trapping ("CPT") or CPT excitation, the VCO is ultimately stabilized. More specifically two separate frequency components of the modulated light are generated, the two frequency components separated in frequency by the value of the atomic hyperfine splitting. The light is directed toward the dual focus optical element wherein the two light fields are simultaneously, expanded, and reflected off the reflector. Passing back through the dual-focus optical element and the quarter-wave waveplate, the light fields are collimated and circularly polarized. Collectively the two light fields interrogate nearly the entire volume of alkali atoms in the vapor cell, exciting the atoms along the propagation path of each beam.

The absorption of light by the gaseous mixture in the vapor cell, which is measured by the detector, is dependent in part on the non-linear behavior of the excited atoms. The nonlinear absorption response is used to generate a difference signal to control the microwave modulation. The smaller the frequency difference, the lower the absorption of light by the cesium (or rubidium) atoms. The detector feeds a near continuous feedback signal to the controller, which sends an error signal to the VCO directing a modification in frequency. Ultimately, the output frequency of the VCO is sufficiently stabilized overall long periods of time, thereby becoming the output frequency of the atomic clock. In at least one embodiment, this enables an atomic clock having a total volume on the order of 1 cm$^3$, and a power consumption of approximately 30 mW produces timing signals with a fractional instability of about $1 \times 10^{-11}$ over an hour or more of optical integration.

Changes may be made in the above methods, devices and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, device and structure, which, as a matter of language, might be said to fall therebetween.

What is claimed is:

1. A micro-structured optics apparatus, comprising:
   a concave microlens to expand a beam of light;
   a first reflector to provide a first reflection of at least a portion of said beam of light; and
   a micro-Fresnel lens to collimate said at least a portion of said beam of light.

2. The apparatus of claim 1, wherein said first reflector is non-planar.

3. The apparatus of claim 1, wherein said first reflector is annular to pass a central second portion of said beam of light without reflection.

4. The apparatus of claim 3, further comprising:
   a second reflector to provide said at least a portion of said beam of light with a second reflection towards said micro-Fresnel lens.

5. The apparatus of claim 1, further comprising:
   a laser to produce said beam of light.

6. The apparatus of claim 5, wherein said laser is a vertical cavity surface emitting laser (VCSEL) laser.

7. The apparatus of claim 5, further comprising:
   a filter to reduce the intensity of said beam of light.

8. The apparatus of claim 5, further comprising:
   a polarization control element to control the polarization state of said beam of light.

9. The apparatus of claim 8, wherein said polarization control element is a ¼-wave plate polarizer.

10. The apparatus of claim 5, further comprising:
    a vapor cell containing gaseous atom species to produce a partial absorption of said beam of light.

11. The apparatus of claim 10, wherein said vapor cell contains a mixture of alkali atoms and a buffer gas to produce said partial absorption of said beam of light.

12. The apparatus of claim 10, further comprising:
    a detector to detect said beam of light downstream from said vapor cell.

13. The apparatus of claim 12, further comprising:
    a VCSEL heater to heat said laser to a predetermined laser operating temperature.

14. The apparatus of claim 12, further comprising:
    a vapor cell heater to heat said vapor cell to a predetermined vapor cell operating temperature.

15. A micro-structured optics apparatus, comprising:
    a concave microlens formed in a substrate to expand a beam of light;
    a reflector to reflect said beam of light;
    a micro-Fresnel lens formed in said substrate, said micro-Fresnel lens established along a central axis of reflector to collimate a portion of said beam of light after said reflection.

16. The apparatus of claim 15, wherein said reflector has a convex reflecting surface to expand said beam of light after reflection.

17. The apparatus of claim 15, wherein said first reflector is annular to pass a central second portion of said beam of light without reflection.

18. The apparatus of claim 17, further comprising:
    a second reflector to provide said at least a portion of said beam of light with a second reflection towards said micro-Fresnel lens.

19. The apparatus of claim 15, further comprising:
    a laser to produce said beam of light.

20. The apparatus of claim 19, wherein said laser is a vertical cavity surface emitting laser (VCSEL) laser.

21. The apparatus of claim 19, further comprising:
    a filter to reduce the intensity of said beam of light.

22. The apparatus of claim 21, further comprising:
    a polarization control element said beam of light.

23. The apparatus of claim 22, wherein said polarization control element is a ¼-wave plate polarizer.

24. The apparatus of claim 19, further comprising:
    a vapor cell positioned to receive said portion of said beam of light after said collimation.

25. The apparatus of claim 24, further comprising:
    a detector to detect said beam of light downstream from said vapor cell.

26. The apparatus of claim 24, further comprising:
    a heater to heat said laser to a predetermined laser operating temperature.

27. The apparatus of claim 24, further comprising:
    a vapor cell heater to heat said vapor cell to a predetermined vapor cell operating temperature.

28. A micro-structured apparatus, comprising:
    a laser to produce a beam of light;
    a concave microlens to expand said beam of light; and
    a micro-Fresnel lens to collimate a portion of said beam of light after said expansion.

29. The apparatus of claim 28, further comprising:
    a vapor cell positioned to receive said portion of collimated beam of light.

30. The apparatus of claim 29, further comprising:
    a detector to detect the intensity of said beam of light after passing through said vapor cell.

* * * * *